United States Patent [19]
Kawanabe

[11] 4,215,318
[45] Jul. 29, 1980

[54] PUSH-PULL AMPLIFIER
[75] Inventor: Yoshihiro Kawanabe, Tokyo, Japan
[73] Assignee: Pioneer Electronic Corporation, Tokyo, Japan
[21] Appl. No.: 967,534
[22] Filed: Dec. 7, 1978
[30] Foreign Application Priority Data
  Dec. 8, 1977 [JP] Japan .............................. 52-147645
[51] Int. Cl.² ............................................. H03F 3/21
[52] U.S. Cl. ................................... 330/268; 330/274
[58] Field of Search ..................... 33/207 P, 265, 267, 33/268, 270, 273, 274, 298

[56] References Cited
U.S. PATENT DOCUMENTS
3,495,181  2/1970  Reiffin ............................ 330/298 X
4,077,013  2/1978  Morez et al. .................... 330/268 X

*Primary Examiner*—James B. Mullins
*Attorney, Agent, or Firm*—Sughrue, Rothwell, Mion, Zinn & Macpeak

[57] ABSTRACT

A push-pull amplifier having a pair of output transistors and a pair of emitter coupled resistors, one terminal of each resistor coupled to an emitter of a respective transistor and the other terminals being commonly connected to an output point. A comparison circuit is employed for comparing the voltages across each of the emitter resistors with a predetermined voltage. A bias circuit is connected in series between the bases of the output transistors and a short circuit controlled by the output of the comparison circuit selectively shorts a resistor element in the bias circuit.

4 Claims, 3 Drawing Figures

PUSH-PULL AMPLIFIER

BACKGROUND OF THE INVENTION

This invention relates to a push-pull amplifier employed in audio equipments as an output amplifier.

Push-pull amplifiers are referred to generally as power amplifiers, and various types of such power amplifiers have been conventionally employed. Basic types of the power amplifiers are classes "A" and "B" complementary push-pull amplifiers. The class "A" complementary push-pull amplifier is advantageous in that no switching distortion is produced, since a pair of output transistors always operates in the active region and it does not shift to the cut-off region. This type is disadvantageous in that heat loss is large due to a large amount of bias current. On the other hand, in the class "B" complementary push-pull amplifier heat loss is small since the amount of bias current is relatively small in comparison with a class "A" amplifier. However, switching distortion is inversely produced due to the fact that the pair of output transistors alternatively shifts to the cut-off region.

SUMMARY OF THE INVENTION

Accordingly, it is an object of the present invention to provide an improved push-pull amplifier which eliminates the above-noted drawbacks accompanying both classes "A" and "B" push-pull amplifiers.

It is another object of this invention to define an improved push-pull amplifier not subject to switching distortion and is low in heat loss.

In order to attain the objects of the invention, a comparison circuit is provided for comparing the voltage between the emitter resistors of the output transistors with a predetermined voltage. A bias circuit is connected in series between the base of the output transistors, the bias circuit including a resistor element. A short circuit is employed for operating to short the resistor element in response to the output of the comparison circuit. In one preferred embodiment, a differential circuit is employed for the comparison circuit, and a pair of transistors having emitters connected commonly is employed for the short circuit.

DETAILED DESCRIPTION OF THE PREFERRED EMBODIMENT

One embodiment according to the present invention will now be described with reference to the accompanying drawings.

Figure 1:
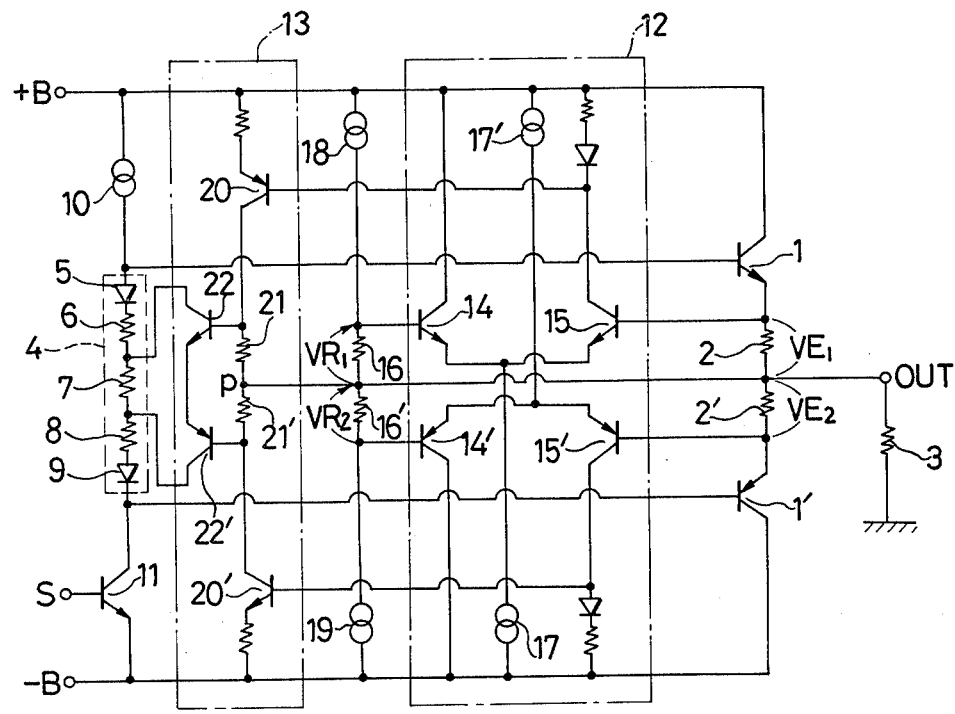
FIG. 1 is a circuit diagram of a push-pull amplifier showing one embodiment according to the present invention.

In FIG. 1, the emitters of an NPN transistor 1 and a PNP transistor 1', both being complementary output transistors, are commonly connected to an output point out through resistors 2 and 2', respectively. A load 3 is connected between the output point out and ground. Between the bases of the transistors 1 and 1', a bias circuit 4 for applying base biases to the transistors 1 and 1' is connected.

The bias circuit 4 comprises a diode 5, resistors 6–8 and a diode 9, all of which are connected in series in this order. Bias current is supplied from a constant current source 10 to the bias circuit 4. A signal applied to an input transistor 11 from an input S is developed across the both terminals of the bias circuit 4, and the push-pull amplification operation is effectuated by the output transistors 1 and 1'. This drives the load 3. The load 3 may be a typically a loud speaker. A comparison circuit 12 is connected to the emitters of the transistors 1 and 1', such that voltages $VE_1$ and $VE_2$ across the resistors 2 and 2', respectively, are compared with predetermined voltages. A short circuit 13 is provided between the terminals of the resistor 7 operating to short the resistor 7 in response to the output of the comparison circuit 12.

The comparison circuit 12 at the side of the transistor 1 comparises a pair of transistors 14 and 15, with respective emitters commonly connected. The base of the transistor 15 is connected to the emitter of the transistor 1, and the base of the transistor 14 is connected to one terminal of a resistor 16. The other terminal of the resistor 16 is connected to the output point out. The comparison circuit 12 at the side of the transistor 1 further comprises a differential circuit having a constant current source 17 which controls the emitter current of both the transistors 14 and 15. Constant current is supplied from constant current sources 18 and 19 to the resistor 16 to thereby produce a constant voltage $VR_1$ to be applied to the base of the transistor 14. The comparison circuit 12 (at the side of the transistor 1') is identically constructed to that of the transistor 1 wherein constant voltage $VR_2$ is applied to the base of the transistor 14' by the resistor 16'.

The short circuit 13 includes transistors 20 and 20' which are controlled by the output of the comparison circuit 12. The collectors of the transistors 20 and 20' are connected to one of the terminals of the resistors 21 and 21', respectively, and to the bases of transistors 22 and 22', respectively. The emitters of the transistors 22 and 22' are connected commonly and the collectors thereof are connected to both terminals of the resistor 7. The junction point P of the resistors 21 and 21' is connected to the output point out.

Figure 2:
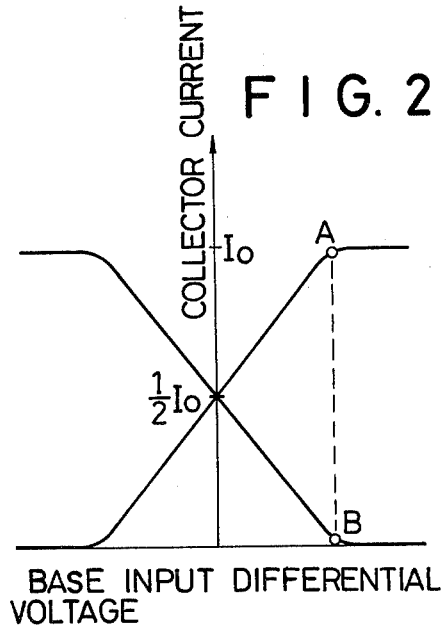
FIG. 2 is a graphical representation showing operational characteristics of the differential circuit.

The operation of the push-pull amplifier shown in FIG. 1 will be described with reference to FIG. 2. In the case of no input signal, the operational points of the transistors 15 and 15' of the comparison circuit 12 are set to be at the "A" level point on FIG. 2, while the operational points of the transistors 14 and 14' are set to be at the "B" point. In this condition, the transistors 20 and 20' of the short circuit 13 are rendered conductive, and accodingly the transistors 22 and 22' are rendered conductive as well. As a result, the resistor 7 in the bias circuit 4 is shorted.

When the output point out is at a positive potential in accordance with the condition of the input signal, the voltage $VE_1$ between the emitter of the transistor 1 and the output point out is increased. However, as is apparent from FIG. 2, the collector current of the transistor 15 dos not increase, and the condition of the transistor 20 does not change. At this time, the voltage $VE_2$ between the emitter of the transistor 1' and the output point out is decreased and accordingly the current flowing into the transistor15' is decreased.

For this reason, the current flowing into the transistor 20' is decreased, and therefore the current flowing into the resistor 21' is accordingly decreased. The current flowing into the transistors 22 and 22' which are biased by the resistors 21 and 21' is also decreased. As a result, current flows into the resistor 7 of the bias circuit 4, thereby developing a voltage across the resistor 7.

Due to the voltage across the resistor 7, the voltage between the bases of the transitors 1 and 1' increases to thereby complement the decrease of the voltage $VE_2$. Consequently, it becomes possible to prevent the transistor 1' from shifting to the cut-off region caused by the decrease of the bias voltage $VE_2$.

When the output point out is at a negative potential in accordance with the condition of the input signal, current flowing into the resistor 21 is decreased in the same manner as described and current flowing into the transistors 22 and 22' are decreased. As a result, voltage is developed across the resistor 7. Due to the voltage thereacross, the transistor 1 is prevented from shifting to the cut-off region.

Figure 3:
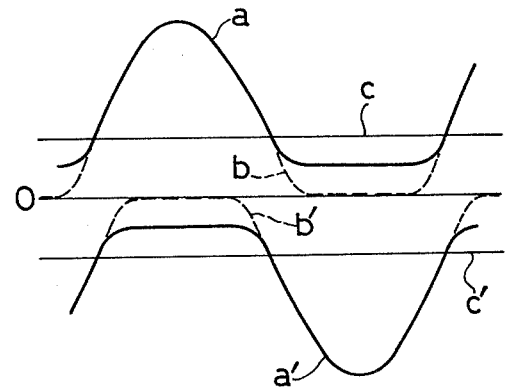
FIG. 3 is a current waveforms of the output transistors.

Accordingly, as shown in FIG. 3, current a and a' flowing into the NPN transistor 1 and the PNP transistor 1' do not become zero, and both transistors are operated in the active regions all the time. Further, at the time of no input signal, the idle current in the transistors 1 and 1' are sufficiently small in comparison with that of the class "A" amplifying circuit.

Modifications of this invention are possible without departing from the essential scope of this invention.

What is claimed is:

1. In a push-pull amplifier of the type including a pair of output transistors and a pair of emitter resistors, a respective resistor connected to the emitter of a respective output transistor at one terminal, the other terminals of the emitter resistors being commonly connected to an output point, the improvement comprising:

(a) a comparison circuit for comparing the voltages across each of said emitter resistors with a predetermined voltage, said comparison circuit comprising a pair of differential circuits, one of said differential circuits including a pair of first transistors having emitters commonly connected and a first constant current source for controlling the emitter current of said pair of first transistor, the other of said differential circuits including a pair of second transistors having emitters commonly connected and a second constant current source for controlling the emitter current of said pair of second transistors;

(b) a bias circuit connected in series between the bases of said pair of output transistors, said bias circuit comprising a resistor element; and (c) short circuit means for selectively shorting said resistor element responsive to an output of said comparison circuit.

2. The push-pull amplifier as recited in claim 1 wherein said short circuit means comprises a pair of third transistors, the emitters of said pair of third transistors being commonly connected, and said resistor element being connected between the collectors of said pair of third transistors.

3. The push-pull amplifier of claim 2 wherein said bias circuit further comprises a pair of resistors coupled to respective terminals of said resistor element and a pair of diodes coupled to said pair of resistors.

4. The push-pull amplifier of claim 2 wherein said short circuit means further comprises a pair of fourth transistors, the collectors of said pair of fourth transistors being coupled to the bases of said pair of third transistors and the bases of said pair of fourth transistors being driven by the output of said comparison circuit.

* * * * *